(12) United States Patent
Ito et al.

(10) Patent No.: US 6,835,916 B2
(45) Date of Patent: *Dec. 28, 2004

(54) CERAMIC HEATER

(75) Inventors: Yasutaka Ito, Gifu (JP); Yasuji Hiramatsu, Gifu (JP)

(73) Assignee: Ibiden, Co., LTD, Ogaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/226,160

(22) Filed: Aug. 23, 2002

(65) Prior Publication Data

US 2003/0102299 A1 Jun. 5, 2003

Related U.S. Application Data

(63) Continuation-in-part of application No. 09/926,261, filed as application No. PCT/JP00/05156 on Aug. 1, 2000, now Pat. No. 6,465,763.

(30) Foreign Application Priority Data

Aug. 9, 1999 (JP) .......................................... 11-225696
Apr. 28, 2000 (JP) ....................................... 2000-131210

(51) Int. Cl.[7] ............................. H05B 3/68; C23C 16/00
(52) U.S. Cl. .................................. 219/444.1; 118/425
(58) Field of Search ......................... 219/443.1, 444.1, 219/543, 544, 546, 547, 548; 118/724, 725

(56) References Cited

U.S. PATENT DOCUMENTS

| 5,643,483 A | 7/1997 | Kubota et al. |
| 5,665,260 A | 9/1997 | Kawada et al. |
| 6,465,763 B1 | 10/2002 | Ito et al. |
| 6,507,006 B1 | 1/2003 | Hiramatsu et al. |

FOREIGN PATENT DOCUMENTS

| EP | 0 506 391 | 9/1992 |
| EP | 1 109 423 | 6/2001 |
| JP | 4-32184 | 2/1992 |
| JP | 4-324276 | 11/1992 |
| JP | 6-65629 | 8/1994 |
| JP | 7-103482 | 4/1995 |
| JP | 7-201718 | 8/1995 |
| JP | 7-280462 | 10/1995 |
| JP | 9-306642 | 11/1997 |
| JP | 10-087382 | 4/1998 |
| JP | 10-104184 | 4/1998 |
| JP | 11-40330 | 2/1999 |
| JP | 2001-116936 | 4/2001 |
| JP | 2001-118664 | 4/2001 |
| WO | WO 01/11923 A1 | 2/2001 |

OTHER PUBLICATIONS

U.S. patent application Ser. No. 10/732,296, Ito et al., filed Dec. 11, 2003.
U.S. patent application Ser. No. 10/746,081, Hiramatsu et al., filed Dec. 29, 2003.
U.S. patent application Ser. No. 10/755,308, Hiramatsu et al., Jan. 13, 2004.
U.S. patent application Ser. No. 10/766,027, Ito et al., filed Jan. 29, 2004.
U.S. patent application Ser. No. 10/759,083, Hiramatsu et al., filed Jan. 20, 2004.

(List continued on next page.)

Primary Examiner—Sang Paik
(74) Attorney, Agent, or Firm—Oblon, Spivak, McClelland, Maier & Neustadt, P.C.

(57) ABSTRACT

An object of the present invention is to provide a ceramic heater making it possible to suppress an outflow of heat to a supporting case and so on to make the temperature of its ceramic substrate uniform. The ceramic heater of the present invention is a ceramic heater wherein a heating element is arranged on a surface of a ceramic substrate or inside the ceramic substrate, the surface roughness Rmax of the side face of the ceramic substrate being from 0.1 to 200 μm according to JIS B 0601.

7 Claims, 4 Drawing Sheets

OTHER PUBLICATIONS

U.S. patent application Ser. No. 09/806,477, Ito et al., filed Jun. 25, 2001.
U.S. patent application Ser. No. 09/831,887, Ito et al., filed May 23, 2001.
U.S. patent application Ser. No. 09/807,960, Hiramatsu et al., filed May 18, 2001.
U.S. patent application Ser. No. 09/806,478, Ito et al., filed Jul. 26, 2001.
U.S. patent application Ser. No. 09/926,012, Hiramatsu et al., filed Oct. 24, 2001.
U.S. patent application Ser. No. 09/926,092, Ito et al., filed Dec. 27, 2001.
U.S. patent application Ser. No. 09/926,297, Hiramatsu et al., filed Dec. 26, 2001.
U.S. patent application Ser. No. 09/926,296, Ito et al., filed Dec. 27, 2001.
U.S. patent application Ser. No. 09/926,362, Hiramatsu et al., filed Jan. 16, 2002.
U.S. patent application Ser. No. 09/926,464, Hiramatsu et al., filed Jan. 10, 2002.
U.S. patent application Ser. No. 09/926,499, Hiramatsu et al., filed Mar. 26, 2002.
U.S. patent application Ser. No. 09/926,714, Ito et al., filed Dec. 6, 2001.
U.S. patent application Ser. No. 10/009,174, Hiramatsu et al., filed Apr. 21, 2003.
U.S. patent application Ser. No. 10/019,448, Ito et al., filed Apr. 8, 2002.
U.S. patent application Ser. No. 10/019,444, Hiramatsu et al., filed Apr. 23, 2002.
U.S. patent application Ser. No. 10/019,280, Ito et al., filed Apr. 22, 2002.
U.S. patent application Ser. No. 10/019,311, Hiramatsu et al., filed Apr. 9, 2002.
U.S. patent application Ser. No. 10/048,490, Ito et al., filed Apr. 30, 2002.
U.S. patent application Ser. No. 10/048,979, Hiramatsu et al., Apr. 26, 2002.
U.S. patent application Ser. No. 10/048,989, Hiramatsu et al., filed May 29, 2002.
U.S. patent application Ser. No. 10/069,511, Ito et al., filed Jun. 24, 2002.
U.S. patent application Ser. No. 10/069,510, Hiramatsu et al., filed Jun. 20, 2002.
U.S. patent application Ser. No. 10/088,098, Ito et al., filed May 30, 2002.
U.S. patent application Ser. No. 10/118,967, Ito et al., filed Apr. 10, 2002.
U.S. patent application Ser. No. 10/226,160, Ito et al., filed Aug. 23, 2002.
U.S. patent application Ser. No. 10/229,177, Hiramatsu et al., filed Aug. 28, 2002.
U.S. patent application Ser. No. 10/277,818, Hiramatsu et al., filed Oct. 23, 2002.
U.S. patent application Ser. No. 10/352,138, Hiramatsu et al., filed Jan. 28, 2003.
U.S. patent application Ser. No. 10/346,095, Ito et al., filed Jan. 17, 2003.
U.S. patent application Ser. No. 10/344,148, Kariya et al., filed Jul. 29, 2003.
U.S. patent application Ser. No. 10/386,615, Hiramatsu et al., filed Mar. 13, 2003.
U.S. patent application Ser. No. 10/363,310, Ito, filed Mar. 3, 2003.
U.S. patent application Ser. No. 10/397,321, Hiramatsu et al., filed Mar. 27, 2003.
U.S. patent application Ser. No. 10/442,967, Hiramatsu et al., filed May 22, 2003.
U.S. patent application Ser. No. 10/618,651, Ito et al., filed Jul. 15, 2003.
U.S. patent application Ser. No. 10/618,623, Ito et al., filed Jul. 15, 2003.
U.S. patent application Ser. No. 10/618,655, Ito et al., filed Jul. 15, 2003.
U.S. patent application Ser. No. 10/618,665, Ito et al., filed Jul. 15, 2003.
U.S. patent application Ser. No. 10/619,567, Hiramatsu et al., filed Jul. 16, 2003.

CERAMIC HEATER

TECHNICAL FIELD

The present invention relates to a ceramic heater: which can be mainly used in the semiconductor industry, the optical communication equipment industry, the electronic communication equipment industry and the like; and which is mainly used for heating a semiconductor wafer, or as an element for temperature adjustment for an optical device.

BACKGROUND ART

A semiconductor product is produced through the step of forming a photosensitive resin as an etching resist on a semiconductor wafer and subjecting the semiconductor wafer to etching, and the like steps.

This photosensitive resin is liquid, and is applied onto a surface of the semiconductor wafer, using a spin coater or the like. In order to scatter solvent and so on after the application, the resin must be dried. Thus, the semiconductor wafer subjected to the application is put on a heater and heated.

Hitherto, as a heater made of metal and used for such a purpose, a heater wherein heating elements are arranged on the back surface of an aluminum plate is adopted.

However, such a heater made of metal has the following problems.

First, the thickness of the heater must be as thick as about 15 mm since the heater is made of metal. This is because a warp, a strain and so on are generated in a thin metal plate because of thermal expansion resulting from heating so that a semiconductor wafer put on the metal plate is damaged or inclined. However, if the thickness of the heater is made thick, problems such that the heater becomes heavy and bulky arise.

Heating temperature is controlled by changing the voltage or amperage applied to the heating elements. However, if the metal plate is thick, the temperature of the heater plate does not follow the change in the voltage or amperage promptly. Thus, a problem that the temperature cannot be easily controlled is caused.

Thus, as described in Japanese Kokai Publication Hei 9-306642, Japanese Kokai Publication Hei 4-324276, Japanese Kokai Publication Hei 7-280462, U.S. Pat. No. 5,643, 483 Specification and so on, ceramic heaters wherein AlN, which is a non-oxidized ceramic having a large thermal conductivity and a large strength, is used as a substrate and heating elements are formed on a surface of this AlN substrate or inside the AlN substrate are suggested.

Such a ceramic heater is usually used, being fitted into a supporting case through a seal ring.

SUMMARY OF THE INVENTION

However, in tests performed by the inventors, there arose an unexpected problem that uneven temperature portions were generated in the periphery of a wafer-heating surface of such a ceramic heater.

Also, particularly in the case that a ceramic substrate was placed without being fitted into the case, there arose a problem that the side face of the ceramic substrate was exposed so that small particles originated from ceramic grains fell down from the side face.

The problem of the unevenness of the temperature in the wafer-heating surface is considered to be related to a contact area between the side face and the seal ring. It is assumed that when the surface roughness of the side face is made too small, the contact area becomes large so that heat is conducted through the seal ring, thus a low-temperature area is generated in the periphery of the ceramic heater.

Thus, the inventors made eager investigations on the problems in the prior art. As a result, the inventors have found that when a ceramic substrate is fitted through a seal ring, the contact portion between the ceramic substrate and the seal ring can be made to be point-contact by making the side face of the ceramic substrate coarse to have a roughness within a given range, so that the temperature of the ceramic substrate can be made uniform.

The inventors have also found the following. If the surface roughness of the side face is too large, in the case that the side face of the ceramic substrate is exposed without contacting the seal ring, the side face exhibits an effect like a heat-radiating fin so that uneven temperature portions are generated in the periphery, also, small particles are generated. When the surface roughness is set within a given range, such a problem can be overcome. As a result, the present invention has been completed.

That is, the ceramic heater of the present invention is a ceramic heater, wherein a heating element is arranged on a surface of a ceramic substrate or inside the ceramic substrate, the surface roughness Rmax of the side face of the ceramic substrate being from 0.1 to 200 $\mu$m according to JIS B 0601.

According to the ceramic heater of the present invention, its side face is made coarse to have a roughness within a given range. Therefore, when the ceramic substrate is fitted into a supporting case, the contact of the side face of the ceramic substrate with the supporting case is made to point-contact. Thus, conduction of heat from the ceramic heater to the supporting case is suppressed so that the temperature of the ceramic substrate can be made uniform.

If the surface roughness of the side face is too large, such an effect like a heat-radiating fin is exhibited even when the substrate contacts a seal ring. Thus, heat is radiated so that a low-temperature area is generated in the peripheral portion of the ceramic substrate. On the other hand, if the surface roughness is too small, the contact area with the seal ring becomes large. Also, even if the seal ring is not present, air which is contacting the side faces does not stay. Therefore, amount of heat-radiation is increased so that a low-temperature area is generated in the peripheral portion of the ceramic substrate.

In short, the inventors have found out that a specific range is present on the roughness of the side face of a ceramic substrate for reducing the amount of heat-radiation. In the present invention, if the temperature difference between the highest temperature and the lowest temperature of the heating surface of the ceramic substrate is about 0.5° C. at 180° C., about 8° C. (2%) at 400° C. and about 20° C. (4%) at 500° C., the ceramic substrate is considered to be practical. In order to achieve the above ranges of the temperature difference, the surface roughness Rmax of the side face of the ceramic substrate should be set to 0.1 to 200 $\mu$m, and is desirably set to 0.5 to 200 $\mu$m.

The above ceramic substrate has a high thermal conductivity, can cause the surface temperature of the heater plate to follow a change in the temperature of the heating element promptly, and can control the temperature in its wafer-heating surface satisfactorily. Additionally, the ceramic substrate has a great mechanical strength. Therefore, the heater plate is not warped so that a semiconductor wafer put thereon can be prevented from being damaged.

In the ceramic heater of the present invention, the ceramic substrate is desirably fitted into a supporting case, and is desirably made of a nitride ceramic, a carbide ceramic or an oxide ceramic.

The ceramic heater is desirably for heating a semiconductor wafer, and the thickness of the ceramic substrate is desirably over 1.5 mm.

Figure 1:
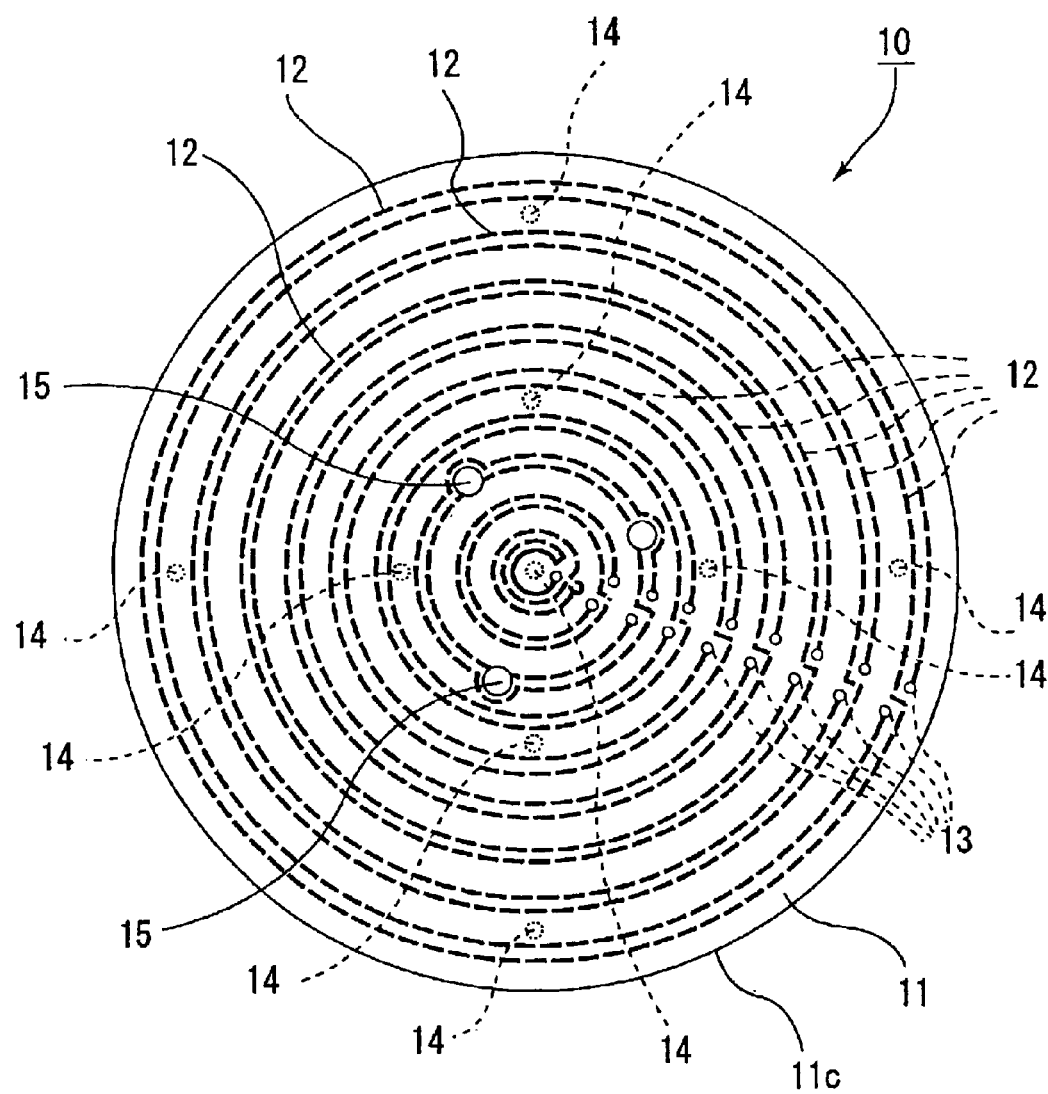
FIG. 1 is a bottom surface view that schematically shows an example of the ceramic heater, for heating a semiconductor wafer, of the present invention.

EXPLANATION OF SYMBOLS 1 element for temperature adjustment
10 ceramic heater
11 heater plate
11a wafer-heating surface
11b bottom surface
11c side face
12 heating element
12a metal covering layer
13 external terminal
14 bottomed hole
15 through hole
16 lifter pin
19 semiconductor wafer
40 optical module

DETAILED DISCLOSURE OF THE INVENTION

The ceramic heater of the present invention is a ceramic heater wherein a heating element is arranged on a surface of a ceramic substrate or inside the ceramic substrate, the surface roughness Rmax of the side face of the ceramic substrate being from 0.1 to 200 μm according to JIS B 0601.

That is, the ceramic heater of the present invention is a ceramic heater comprising a ceramic substrate having two opposing surfaces and a side face, and a heating element on one of the two opposing surfaces of the ceramic substrate or inside the ceramic substrate, wherein the surface roughness Rmax of the side face of said ceramic substrate is from 0.1 to 200 μm according to JIS B 0601.

Figure 2:
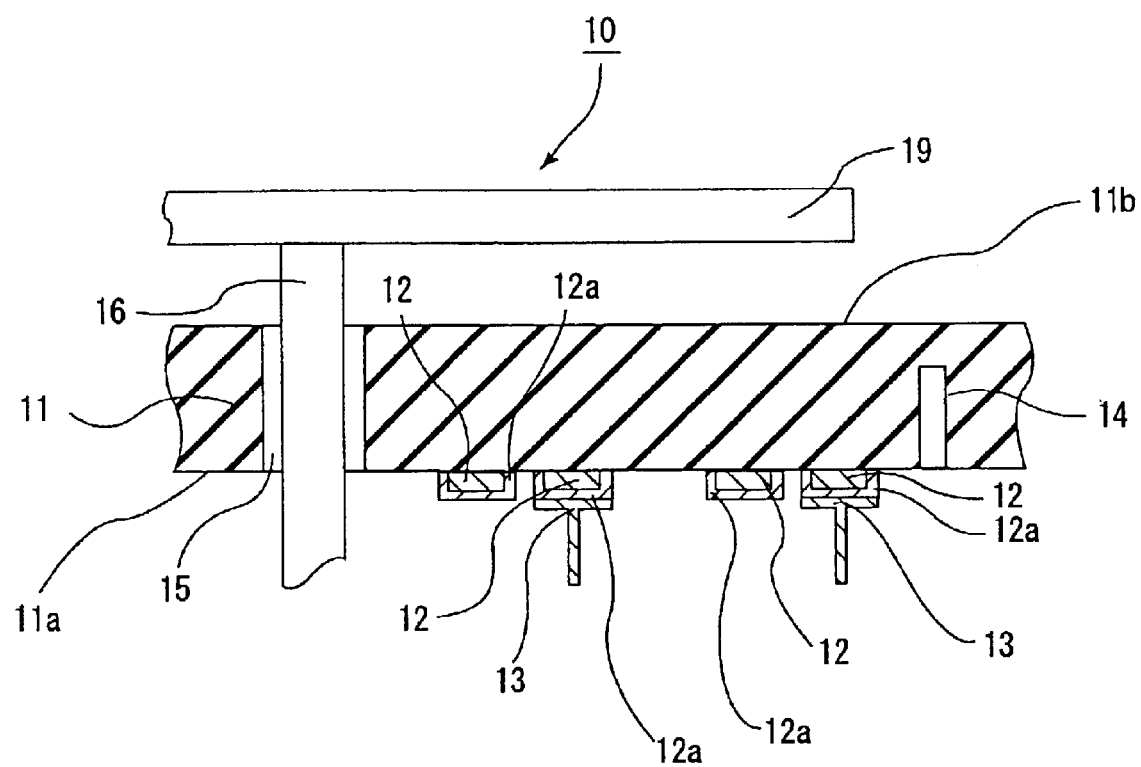
FIG. 2 is a sectional view that schematically shows a part of the semiconductor wafer heating ceramic heater shown in FIG. 1.

FIG. 1 is a plan view that schematically shows an example of the ceramic heater of the present invention. FIG. 2 is an enlarged partial sectional view that schematically shows a part thereof.

A substrate made of a ceramic (which may be referred to as a heater plate hereinafter) 11 is made into a disc form. Heating elements 12 are formed into a pattern of concentric circles on the bottom surface of the heater plate 11 to heat a thing to be heated in such a manner that the temperature on a wafer-heating surface 11b of the heater plate 11 becomes uniform.

In these heating elements 12, two concentric circles near to each other, as one set, are connected into one line. External terminals 13, which will be input/output terminals, are connected to two ends thereof through a metal covering layer 12a. Through holes 15 into which lifter pins 16 for transporting a semiconductor wafer 19, and so on are inserted are made in areas near the center. Bottomed holes 14 into which temperature measuring elements are fitted are also made.

In the ceramic heater 10 shown in FIGS. 1 and 2, the heating elements 12 are arranged on the bottom surface of the heater plate 11, but may be arranged inside the heater plate 11.

The following will describe members constituting the ceramic heater of the present invention, and so on.

In the ceramic heater 10 of the present invention, a nitride ceramic, a carbide ceramic or an oxide ceramic is used as the material of the heater plate. This is based on the following reason. The ceramic has a smaller thermal expansion coefficient than metals. Thus, even if the ceramic is made thin, the ceramic is not warped or distorted by heating. As a result, the heater plate 11 can be made thin and light.

Since the thermal conductivity of the heater plate 11 is high and the heater plate itself is thin, the surface temperature of the heater plate 11 follows a change in the temperature of the heating elements promptly. In other words, the surface temperature of the heater plate 11 can be satisfactorily controlled by changing voltage or amperage to change the temperature of the heating elements.

The above-mentioned properties of the ceramic heater are particularly superior when a nitride ceramic is used as the material of the heater plate.

Examples of the nitride ceramic include aluminum nitride, silicon nitride, boron nitride and titanium nitride. Examples of the carbide ceramic include silicon carbide, titanium carbide and boron carbide. Examples of the oxide ceramic include alumina, cordierite, mullite, silica and beryllia. These may be used alone or in combination of two or more.

Among these, aluminum nitride is most preferred. This is because its thermal conductivity is highest, that is, 180 W/m·K.

A side face 11c of the heater plate 11 is subjected to roughening treatment in the manner that the surface roughness Rmax according to JIS B 0601 is set to 0.1 to 200 μm and desirably to 0.5 to 200 μm in order to prevent the temperature of the peripheral portion of the wafer-heating surface from dropping by conduction of heat from the side face 11c of the heater plate 11 to a supporting case.

If the surface roughness Rmax is below 0.1, air does not stay at all near the side face portion in the case that the side face portion is exposed. Fresh air is successively brought into contact with the side face so that heat is taken by the air. Hence, the temperature is apt to drop. In the case that the side face contacts a seal ring, the contact area with the seal ring becomes large so that heat is conducted through the seal ring. Thus, the temperature is apt to drop. Even if the Rmax is below 0.5 μm, there is a case in which heat is easily conducted from the side face of the heater plate to the seal ring so that the temperature of the peripheral portion of the wafer-heating surface is not easily prevented from dropping since the contact with the seal ring is substantially face contact.

On the other hand, if the Rmax of the surface roughness is over 200 μm, the roughening treatment itself becomes difficult and further the amount of heat-radiation is increased by such an effect that a heat-radiating fin has. As a result, it becomes difficult to prevent the temperature of the peripheral portion from dropping, as well.

In short, the temperature of the peripheral portion can be prevented from dropping by adjusting Rmax to 0.1 to 200 μm and desirably 0.5 to 200 μm regardless of the heater plate and the seal ring contact each other or not.

The adjustment of the surface roughness to Rmax=200 or less makes it possible to prevent ceramic grains from dropping down, hence, suppressing the generation of small particles, and also makes it possible to prevent cracks from being generated in the ceramic substrate because of the temperature difference between the periphery and the inner portion of the substrate, in the case the temperature of the ceramic substrate is rapidly raised.

About the surface roughness, it is optimal that Rmax is 1 to 20 μm. This is because it is prevented that the grains drop down from the roughened surface to generate small particles.

Examples of the method of the roughening treatment is not particularly limited, and include sand blasting wherein grains made of, for example, alumina, zirconia or SiC are blown onto the side-face.

It is also allowable to use a method of polishing the side face with a diamond grindstone of #50 to #800, or a method of polishing the side face with a diamond slurry and then performing the sand blasting.

The thickness of the heater plate 11 in the ceramic heater is preferably 0.5 to 25 mm. If the thickness is thinner than 0.5 mm, the strength is lowered so that the heater plate is easily damaged. If the thickness is thicker than 25 mm, temperature-following capability is lowered. The thickness is more preferably over 1.5 and not more than 5 mm. If the thickness is thicker than 5 mm, heat is not easily conducted so that heating efficiency tends to deteriorate. On the other hand, if the thickness is 1.5 mm or less, the side face area itself is small so that a problem itself of a drop in the temperature of the periphery of the ceramic heater does not arise easily. Also, the strength may drop so that the heater may be damaged.

Japanese Kokai Publication Hei. 2000-21961 discloses an electrostatic chuck having a given surface roughness of its side face, but does not relate to any ceramic heater.

The diameter of the ceramic substrate in the ceramic heater of the present invention is desirably over 150 mm and particularly preferably 200 mm or more. This is because a drop in the temperature of the periphery is more remarkable as such a diameter is larger.

In the ceramic heater of the present invention, a semiconductor wafer may be put on the wafer-putting surface of the ceramic substrate in the state that they contact each other. Besides, a semiconductor wafer may be supported by supporting pins, so as to hold the wafer in the state that a given interval is kept between the wafer and the ceramic substrate. Also, after forming through holes in the ceramic substrate, a wafer may be held by inserting lifter pins in to these through holes. By moving the lifter pins upward and downward, it is possible to receive the wafer from a carrier, put the wafer on the ceramic substrate, or heat the wafer in the state that the wafer is being supported.

The heating element 12 formed on the surface of the ceramic substrate or inside the ceramic substrate is desirably divided into two or more circuits. By the division into the circuits, electric power introduced into the respective circuits can be controlled to change heat quantity. Thus, the temperature of the semiconductor wafer heating surface can be adjusted.

Examples of the pattern of the heating elements 12 include concentric circles, a spiral, eccentric circles, and a bending line. Concentric circles as shown in FIG. 1 are preferred since the temperature of the entire heater plate can be made uniform.

In the case that the heating elements 12 are formed on the surface of the heater plate 11, the following method is preferred: a method of applying a conductor containing paste which is containing metal particles on the surface of the heater plate 11 to form a conductor containing paste layer having a given pattern, and firing this to sinter the metal particles on the surface of the heater plate 11. If the metal particles are melted and adhered to each other and further the metal particles and the ceramic are melted and adhered to each other in the sintering of the metal, the sintering is sufficient.

In the case that the heating elements are arranged on the surface of the heater plate, the heating surface thereof is at the side opposite to the surface on which the heating element is formed. This is because the temperature uniformity of the heating surface is improved since the heater plate diffuses heat.

When the heating elements are formed on the surface of the heater plate 11, the thickness of the heating elements is preferably 1 to 30 μm and more preferably 1 to 10 μm. When the heating elements are formed inside the heater plate 11, the thickness is preferably 1 to 50 μm.

When the heating elements are formed on the surface of the heater plate 11, the width of the heating elements is preferably 0.1 to 20 mm and more preferably 0.1 to 5 mm. When the heating elements are formed inside the heater plate 11, the width of the heating elements is preferably 5 to 20 μm.

The ohmic values of the heating elements 12 can be varied depending on their width or thickness, however the above-mentioned ranges are most practical. The ohmic values become larger as the heating elements become thinner and narrower. The thickness and the width of the heating elements 12 become larger in the case that the heating elements 12 are formed inside the heater plate 11. However, when the heating elements 12 are formed inside, the distance between the heating surface and the heating elements 12 becomes short so that the uniformity of the temperature on the surface falls. Thus, it is necessary to make the width of the heating elements themselves wide. Also, when the heating elements 12 are formed inside, it is unnecessary to consider the adhesiveness to any ceramic, for example, nitride ceramic. Therefore, it is possible to use a high melting point metal such as tungsten or molybdenum, or a carbide of tungsten, molybdenum and the like so that the ohmic values can be made high. For these reasons, the thickness itself may be made large in order to prevent wire-disconnection and soon. It is therefore desired that the heating elements 12 are made to have the above-mentioned thickness and width.

The sectional shape of the heating elements 12 may be rectangular or elliptical, and is preferably flat. The flat sectional shape makes it possible to radiate heat more easily toward the wafer-heating surface. Therefore, temperature-distribution in the heating surface is not easily generated.

The aspect ratio (the width of the heating element/the thickness of the heating element) of the section is desirably 10 to 5000.

Adjustment thereof into this range makes it possible to increase the ohmic value of the heating elements 12 and keep the uniformity of the temperature in the heating surface.

In the case that the thickness of the heating elements 12 is made constant, the amount of heat conduction toward the wafer-heating surface of the heater plate 11 becomes small if the aspect ratio is smaller than the above-mentioned range. Thus, thermal distribution similar to the pattern of the heating elements 12 is generated in the heating surface. On the other hand, if the aspect ratio is too large, the temperature of the portions just above the middle lines of each of the heating elements 12 becomes high so that thermal distribution similar to the pattern of the heating elements 12 is generated in the heating surface. Accordingly, if temperature distribution is considered, the aspect ratio of the section is preferably 10 to 5000.

When the heating elements 12 are formed on the surface of the heater plate 11, the aspect ratio is desirably 10 to 200. When the heating elements 12 are formed inside the heater plate 11, the aspect ratio is desirably 200 to 5000.

The aspect ratio should be larger in the case that the heating elements 12 are formed inside the heater plate 11. This is based on the following reason. If the heating elements 12 are formed inside, the distance between the heating surface and the heating elements 12 becomes short so that temperature uniformity in the surface falls. It is therefore necessary to make the heating elements 12 themselves flat.

The position where the heating elements 12 are formed with deviation inside the heater plate 11 is desirably a position near the surface (bottom surface), which is the surface opposite to the heating surface of the heater plate 11 and within the scope from 50% to 99% of the distance from the heating surface to the bottom surface.

If the value defining the scope is 50% or less, the position is too near to the heating surface so that temperature-dispersion is caused. Conversely, if the value is over 99%, the heater plate 11 itself warps to damage a semiconductor wafer.

In the case that the heating elements 12 are arranged inside the heater plate 11, plural layers for forming the heating element may be formed. In this case, the patterns of the respective layers are desirably in the state that the heating elements 12 are formed on some layer so as to be complementary to each other, and as viewed from a position above the wafer-heating surface, anyone of the patterns is formed in any area. A preferred example of such a structure is a structure of a staggered arrangement.

It is allowable that the heating elements 12 are formed inside the heater plate 11 and a part of the heating elements 12 is exposed.

The conductor containing paste is not particularly limited, and is preferably a paste comprising not only metal particles or a conductive ceramic for keeping electrical conductivity but also a resin, a solvent, a thickener and so on.

Examples of the metal particles include a noble metal (gold, silver, platinum and palladium), lead, tungsten, molybdenum, nickel and the like. These may be used alone or in combination of two or more. These metals are not relatively easily oxidized, and have an ohmic value sufficient for generating heat.

Examples of the conductive ceramic include carbides of tungsten and molybdenum. These may be used alone or in combination of two or more.

The particle diameter of these metal particles or the conductive ceramic is preferably 0.1 to 100 $\mu$m. If the particle diameter is too fine, that is, below 0.1 $\mu$m, they are easily oxidized. On the other hand, if the particle diameter is over 100 $\mu$m, they are not easily sintered so that the ohmic value becomes large.

The shape of the metal particles is spherical or scaly. When these metal particles are used, they may be a mixture of spherical particles and scaly particles.

In the case that the metal particles are scaly or a mixture of spherical particles and scaly particles, metal oxides between the metal particles are easily retained and adhesiveness between the heating elements 12 and the ceramic such as a nitride ceramic is made sure. Moreover, the ohmic value can be made large. Thus, this case is profitable.

Examples of the resin used in the conductor containing paste include epoxy resins and phenol resins. An example of the solvent is isopropyl alcohol. An example of the thickener is cellulose.

It is desired to add a metal oxide to the metal particles in the conductor containing paste and obtain the heating element 12 which is a sintered product of the metal particles with the metal oxide. By sintering the metal oxide together with the metal particles, the ceramic, such as a nitride ceramic, constituting the heater plate can be closely adhered to the metal particles.

The reason why the adhesiveness to the ceramic such as a nitride ceramic by mixing the metal oxide is improved is unclear, but would be based on the following. The surface of the metal particles, or the surface of the ceramic such as a nitride ceramic is slightly oxidized so that an oxidized film is formed. Pieces of this oxidized film are sintered and integrated with each other through the metal oxide so that the metal particles and the ceramic such as a nitride ceramic are closely adhered to each other. In the case that the ceramic constituting the heater plate is an oxide ceramic, the surface is naturally made of the oxide so that a conductive layer having superior adhesiveness can be formed.

A preferred example of the oxide is at least one selected from the group consisting of lead oxide, zinc oxide, silica, boron oxide ($B_2O_3$), alumina, yttria, and titania.

These oxides make it possible to improve adhesiveness between the metal particles and the ceramic such as a nitride ceramic without increasing the ohmic value of the heating elements 12.

When the total amount of the metal oxides is set to 100 parts by weight, the weight ratio of lead oxide, zinc oxide, silica, boron oxide ($B_2O_3$), alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50. The ratio is preferably adjusted within the scope that the total thereof is not over 100 parts by weight.

By adjusting the amounts of these oxides within these ranges, the adhesiveness to the ceramic such as a nitride ceramic can be particularly improved.

The addition amount of the metal oxides to the metal particles is preferably more than 0.1% by weight and less than 10% by weight. The area resistivity when the conductor containing paste having such a conformation is used to form the heating elements 12 is preferably from 1 to 45 m$\Omega$/□.

If the area resistivity is over 45 m$\Omega$/□, the calorific value against an applied voltage becomes too large so that, in the heater plate 11 wherein heating elements 12 are set on its surface, their calorific value is not easily controlled. If the addition amount of the metal oxides is 10% or more by weight, the area resistivity exceeds 50 m$\Omega$/□ so that the calorific value becomes too large. Thus, temperature-control is not easily performed so that the uniformity in temperature distribution falls.

In the case that the heating elements 12 are formed on the surface of the heater plate 11, a metal covering layer 12a is preferably formed on the surface of the heating elements 12. The metal covering layer prevents a change in the ohmic value based on oxidization of the inner metal sintered product. The thickness of the formed metal covering layer 12a is preferably from 0.1 to 10 $\mu$m.

The metal used when the metal covering layer 12a is formed is not particularly limited if the metal is a metal which is hardly oxidized. Specific examples thereof include gold, silver, palladium, platinum, and nickel. These may be used alone or in combination of two or more. Among these metals, nickel is preferred.

This is because; in the heating element 12, a terminal for connecting it to a power source is necessary. This terminal is fixed to the heating element 12 through solder. Nickel prevents solder from being thermally diffused. An example of the connecting terminal is made of kovar.

In the case that the heating elements 12 are formed inside the heater plate 11, no coating is necessary since the surface of the heating elements 12 is not oxidized. In the case that the heating elements 12 are formed inside the heater plate 11, a part of the heating elements may be exposed in the surface. A plated through hole for connecting the heating elements 12 may be made in a portion for the terminal, and an external terminal may be connected and fixed to this plated through hole.

In the case that the external terminal 13 is connected, an alloy such as silver-lead, lead-tin or bismuth-tin can be used as a solder. The thickness of the solder layer is desirably from 0.1 to 50 $\mu$m. This is because this range is a range sufficient for maintaining the connection by the solder.

As shown in FIG. 2, the through hole 15 is made in the heater plate 11 and the lifter pin 16 is inserted into the through hole 15 to make it possible to transfer a semiconductor wafer to a non-illustrated carrier or receive the semiconductor wafer from the carrier.

Figure 3:
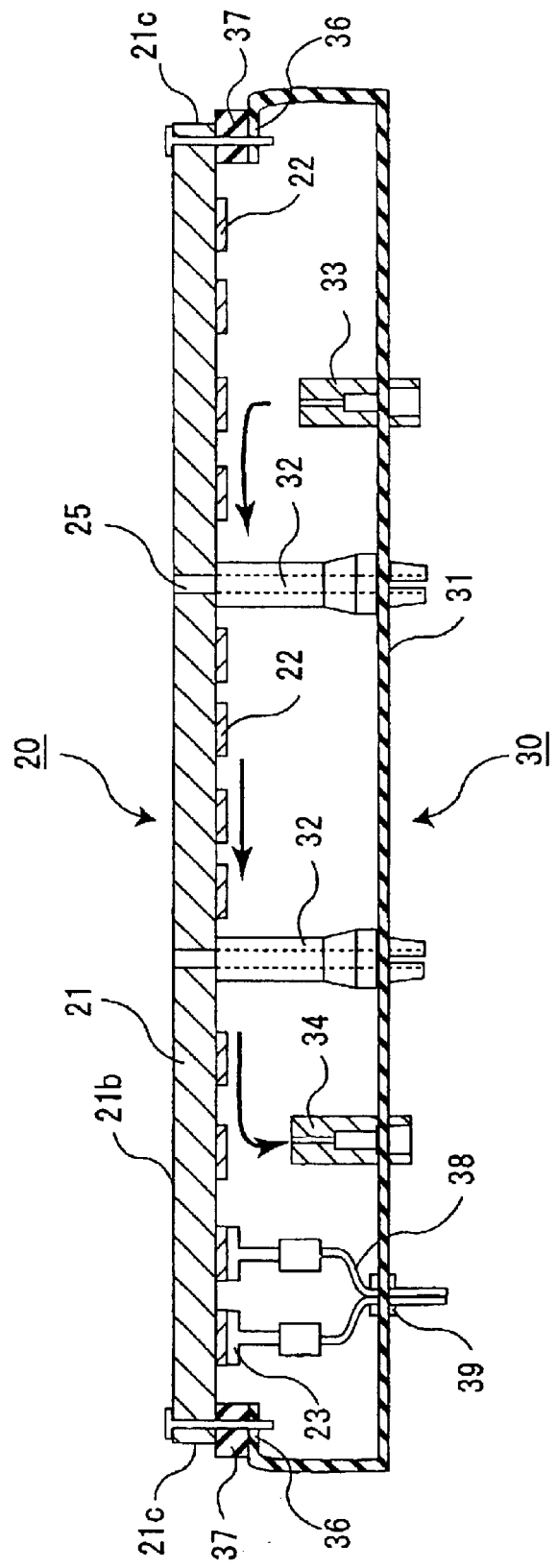
FIG. 3 is a sectional view that schematically shows a supporting case in which the ceramic heater for heating a semiconductor is set.

In many cases, the ceramic heater made as described above is usually set in a supporting case when it is used. FIG. 3 is a sectional view that schematically shows the state that the ceramic heater is fitted into the supporting case.

A supporting case 30 is made mainly of a thin metal material, has a bottomed cylindrical structure, and has a flat plate-form bottom part 31. The upper end portion of the cylinder is folded inwards to constitute an edge portion 36. A seal ring 37 is put and fixed on the edge portion 36. A disc-form ceramic heater 20 is fitted into this seal ring 37.

The bottom part of the ceramic heater 20 is provided with heating elements 22, and through holes 25 are made at the center. In the through holes 25 are inserted lifter pins for supporting a semiconductor wafer put on the ceramic heater 20 and moving the wafer upward and downward.

A bottom part 31 of the supporting case 30 is provided with pin-inserting sleeves 32 in which the lifter pins, which are inserted in the through holes 15 in the ceramic heater 20, are inserted, and a coolant inlet 33 and a coolant outlet 34 for supplying and discharging coolant or the like, respectively. Additionally, the bottom part 31 is provided with a seal packing 39 through which cords 38 from external terminals 23 connected to the ends of the heating elements 22 are passed.

The supporting case 30 has an airtight structure in order to make it possible to supply coolant, in the condition of being fitted with the ceramic heater 20 through the seal ring 37. The supporting case 30 is usually subjected to no special processing.

The following will describe the process for producing a ceramic heater of the present invention.

The following description is a process for producing a ceramic heater (see FIGS. 1 and 2) wherein heating elements are formed on the bottom surface of the heater plate 11.

(1) Step of Making the Heater Plate

If necessary, a sintering aid such as yttria ($Y_2O_3$), a compound containing Na or Ca, a binder and so on are blended with ceramic powder made of the above-mentioned aluminum nitride or the like to prepare a slurry. Thereafter, this slurry is made in to a granule form by spray drying or the like. The granule is put into a mold and pressed to be formed into a plate form or the like form. Thus, a raw formed body(green) is formed.

Next, portions that will be through holes into which lifter pins for supporting a semiconductor wafer are inserted, or portions that will be bottomed holes in which temperature-measuring elements such as thermocouples are embedded are made in the raw formed body if necessary. The through holes and the bottomed holes may be formed by performing the processing to the sintered body after the firing.

Next, this raw formed body is heated and fired to be sintered. Thus, a plate made of the ceramic is produced. Thereafter, the plate is made into a given shape to produce the heater plate 11. The shape after the firing may be such a shape that the sintered product can be used as it is. By heating and firing the raw formed body under pressure, the heater plate 11 having no pores can be produced. It is sufficient that the heating and the firing are performed at sintering temperature or higher. For instance, the firing temperature is 1000 to 2500° C. for nitride ceramics. Thereafter, the side face of the heater plate 11 is subjected to roughening treatment by sand blasting or the like. The roughening treatment may be applied not only to the side face but also to the peripheral portion of the bottom surface of the heater plate 11.

(2) Step of Printing a Conductor Containing Paste on the Heater Plate

A conductor containing paste is generally a fluid comprising metal particles, a resin and a solvent, and has a high viscosity. This conductor containing paste is printed in portions where heating elements are to be formed by screen printing or the like, to form a conductor containing paste layer. Since it is necessary that the heating elements make the temperature of the whole of the heater plate uniform, the conductor containing paste is desirably printed into a pattern of concentric circles, as shown in FIG. 1.

The conductor containing paste is desirably formed in the manner that a section of the heating elements 12 subjected to the firing is rectangular and flat.

(3) Firing of the Conductor Containing Paste

The conductor containing paste layer printed on the bottom surface of the heater plate 11 is heated or fired to remove the resin and the solvent and sinter the metal particles. Thus, the metal particles are baked onto the bottom surface of the heater plate 11 to form the heating elements 12. The heating and firing temperature is preferably 500 to 1000° C.

If the above-mentioned metal oxides are added to the conductor containing paste, the metal particles, the heater plate and the metal oxides are sintered to be integrated with each other. Thus, the adhesiveness between the heating elements and the heater plate is improved.

(4) Step of Forming the Metal Covering Layer

The metal covering layer 12a is desirably formed on the surface of the heating elements 12. The metal covering layer 12a can be formed by electroplating, electroless plating, sputtering or the like. From the viewpoint of mass-productivity, electroless plating is optimal.

(5) Attaching of Terminal Pins and so on

Terminals (external terminals 13) for connecting to a power source are attached up to ends of the pattern of the heating elements 12 with solder. Thermocouples are fixed to the bottomed holes 14 with silver solder, gold solder or the like. Alternatively, a heat-resistant resin such as polyimide is used or sealing glass (lead-based glass) is heated/melted at 400 to 500° C. to perform sealing. Thus, the production of the ceramic heater is finished.

Thereafter, the ceramic heater is fitted to the seal ring 37 of the supporting case 30 shown in FIG. 3, and is used as a heater.

The following will describe a process for producing a ceramic heater wherein the heating elements 12 are formed inside the heater plate 11.

(1) Step of Making the Heater Plate

First, powder of a ceramic such as a nitride is mixed with a binder, a solvent and so on to prepare a paste. This is used to form a green sheet.

As the above-mentioned powder of a ceramic such as a nitride, aluminum nitride and so on can be used. If necessary, a sintering aid such as yttria or a compound containing Na or Ca may be added.

As the binder, desirable is at least one selected from an acrylic binder, ethylcellulose, butylcellusolve, and polyvinyl alcohol.

As the solvent, desirable is at least one selected from α-terpineol and glycol.

A paste obtained by mixing these is formed into a sheet form by the doctor blade process, to form a green sheet.

The thickness of the green sheet is preferably 0.1 to 5 mm.

Next, the following are made in the resultant green sheet if necessary: portions which will be through holes 15 into which lifter pins for supporting a silicon wafer are inserted; portions which will be bottomed holes in which the thermocouples are buried; portions which will be plated through holes 18 for connecting the heating elements to external terminals; and so on. After a green sheet lamination that will be described later is formed, the above-mentioned processing may be performed. Also, this processing may be performed after the sintered body is obtained.

(2) Step of Printing a Conductor Containing Paste on the Green Sheet

A metal paste or a conductor containing paste which is containing a conductive ceramic, for forming the heating elements, is printed on the green sheet. Alternatively, a metal foil formed in a predetermined pattern may be pasted on the green sheet.

This conductor containing paste contains the metal particles or the conductive ceramic particles.

The average particle diameter of tungsten particles or molybdenum particles is preferably 0.1 to 5 $\mu$m. If the average particle is below 0.1 $\mu$m or over 5 $\mu$m, the conductor containing paste is not easily printed.

Such a conductor containing paste may be a composition (paste) obtained by mixing, for example, 85 to 87 parts by weight of the metal particles or the conductive ceramic particles; 1.5 to 10 parts by weight of at least one binder selected from acrylic binders, ethylcellulose, butylcellusolve and polyvinyl alcohol; and 1.5 to 10 parts by weight of at least one solvent selected from α-terpineol and glycol.

(3) Step of Laminating the Green Sheets

Green sheets on which no conductor containing paste is printed are laminated on the upper and lower sides of the green sheet on which the conductor containing paste is printed.

At this time, the number of the green sheet laminated on the upper side is made more than that of the green sheet laminated on the lower side to cause the position where the heating elements are formed to be biased toward the bottom surface.

Specifically, the number of the green sheets laminated on the upper side is preferably 20 to 50, and that of the green sheets laminated on the lower side is preferably 5 to 20.

(4) Step of Firing the Green Sheet Lamination

The green sheet lamination is heated and pressed to sinter the green sheets and the inner conductor containing paste.

The heating temperature is preferably 1000 to 2000° C., and the pressing pressure is preferably 10 to 20 MPa. The heating is performed in the atmosphere of an inert gas. As the inert gas, argon, nitrogen or the like can be used.

Thereafter, the side face of the heater plate is subjected to roughening treatment such as sand blasting. The roughening treatment may be applied not only to the side face but also to the peripheral portion of the bottom surface of the heater plate.

After the sintering, bottomed holes into which temperature-measuring elements are fitted may be made. The bottomed holes can be made by blast treatment such as sandblast after surface-polishing. External terminals 13 are connected, through a solder layer or the like, to plated through holes for connecting the inner heating element, and then the resultant is heated and allowed to reflow. The heating temperature is suitably 200 to 500° C.

Furthermore, thermocouples or the like as temperature-measuring elements are fitted and fixed to the bottomed holes with silver solder, gold solder or the like, and then the holes are sealed with a heat-resistant resin such as polyimide to finish the production of the ceramic heater.

Thereafter, the ceramic heater is fitted to the seal ring 37 for the supporting case 30 shown in FIG. 3, and is used as a heater.

The ceramic heater of the present invention can be used as an electrostatic chuck by setting electrostatic electrodes thereto. The ceramic heater can be used as a wafer prober by forming a chuck top conductive layer on the surface thereof and setting up a guard electrode and a ground electrode inside the heater.

Further, the ceramic heater of the present invention can be used not only as a heater for heating the semiconductor wafer but also as a heater for adjusting the temperature of various types of devices of, for example, an optical communication equipment or electronic communication equipment (as a ceramic heater which serves as an element for temperature adjustment)

For example, in case that an optical waveguide made of: an inorganic material such as quartz, lithium niobate or lithium tantalite; or polymer such as polyimide fluoride is fixed to the ceramic heater of the present invention, the ceramic heater can be used as a heater for temperature adjustment.

Since the refractive index of quartz, a crystal having nonlinear property or polymer varies according to temperature, it is necessary to always keep operating environmental temperature constant. For this reason, the ceramic heater of the present invention is used, whereby it is possible to keep the temperature of the waveguide constant.

The side face of the periphery of the ceramic heater of the present invention is adjusted to have an Rmax of 0.1 to 200 $\mu$m. As already described above, the effect of the flow of the atmospheric gas and the heat-radiating fin can prevent heat radiation. It is, therefore, possible to decrease the temperature difference on the heating surface.

Figure 4:
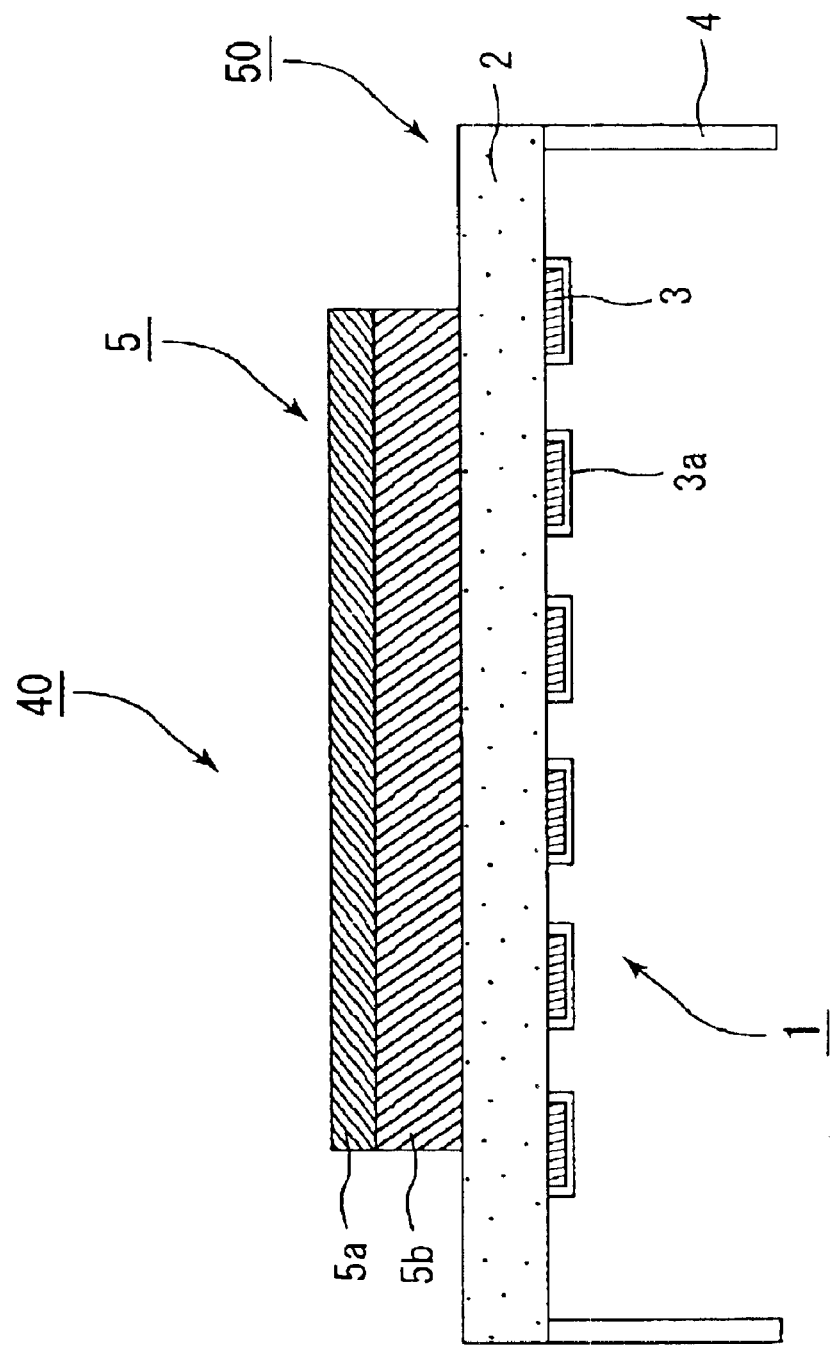
FIG. 4 is a sectional view that schematically shows one example of a ceramic heater used as an element for temperature adjustment constituting an optical module.

FIG. 4 is a sectional view that schematically shows one example of a ceramic heater used as an element for temperature adjustment constituting an optical module.

An optical module 40 comprises an element for temperature adjustment 1 and a quartz type optical waveguide 5.

The element for temperature adjustment 1 includes a ceramic heater 50 wherein the four corners of the bottom of which are supported by stainless pins 4. A resistance heating element 3 is disposed on the bottom face of the ceramic heater 50.

In addition, the quartz type optical waveguide 5 is fixed onto the element for temperature adjustment 1. The quartz type optical waveguide 5 consists of: a Y-shaped core 5b when viewed from the above; and a clad 5a.

If the ceramic heater of the present invention is used as a heater for-adjusting the temperatures of various devices, a metal foil, a sintered body of metal particles, or conductive ceramic can be used as a heating element as described above or a peltier device can be used as a heating element. It is desired that the thickness of the ceramic substrate 2 is 0. 1 to 10 mm. This is because if the thickness exceeds 10 mm, the heat capacity of the ceramic substrate becomes too large and it is difficult to secure temperature uniformity. On the contrary, if the thickness is less than 0.1 mm, a temperature distribution similar to that of a heating element or that of a heat absorbing element occurs and the temperature uniformity is deteriorated.

BEST MODES FOR CARRYING OUT THE INVENTION

EXAMPLE 1

(1) A composition made of 100 parts by weight of aluminum nitride powder (average particle diameter: 1.1 μm), 4 parts by weight of yttria (average particle diameter: 0. 4 μm), 12 parts by weight of an acrylic binder and an alcohol was subjected to spray-drying to make granular powder.

(2) Next, this granular powder was put into a mold and formed into a flat plate form to obtain a raw formed body (green).

(3) The raw formed body subjected to the above-mentioned treatment was hot-pressed at 1800° C. and a pressure of 20 MPa to obtain a nitride aluminum plate having a thickness of 3 mm.

Next, this plate was cut out into a disk having a diameter of 210 mm to prepare a plate (heater plate 11) made of the ceramic. This formed product was subjected to drilling to make portions which would be the through holes 15, into which lifter pins of a semiconductor wafer are inserted, and portions (diameter: 1.1 mm, and depth: 2 mm) which would be the bottomed holes 14, in which thermocouples are embedded.

The side face 11c of this heater plate 11 was subjected to sand blasting with alumina having an average particle diameter of 5 μm so as to make, on the side face 11c, unevenness having an Rmax of 7 μm according to JIS B 0601.

(4) A conductor containing paste was printed on the heater plate 11 obtained in the step (3) by screen printing. The pattern of the printing was made to a pattern of concentric circles as shown in FIG. 1.

The used conductor containing paste was Solvest PS603D made by Tokuriki Kagaku Kenkyu-syo, which is used to form plated through holes in printed circuit boards.

This conductor containing paste was a silver-lead paste and contained 7.5 parts by weight of metal oxides comprising lead oxide(5% by weight), zinc oxide (55% by weight), silica (10% by weight), boron oxide (25% by weight) and alumina (5% by weight) per 100 parts by weight of silver. The silver particles had an average particle diameter of 4.5 μm, and were scaly.

(5) Next, the heater plate 11 on which the conductor containing paste was printed was heated and fired at 780° C. to sinter silver and lead in the conductor containing paste and bake them onto the heater plate 11. Thus, the heating elements 12 were formed. The silver-lead heating elements had a thickness of 5 μm, a width of 2.4 mm and a area resistivity of 7.7 mΩ/□

(6) The heater plate 11 formed in the step (5) was immersed into an electroless nickel plating bath consisting of an aqueous solution containing 80 g/L of nickel sulfate, 24 g/L of sodium hypophosphite, 12 g/L of sodium acetate, 8 g/L of boric acid, and 6 g/L of ammonium chloride to precipitate the metal covering layer (nickel layer) 12a having a thickness of 1 μm on the surface of the silver-lead heating elements 12.

(7) By screen printing, a silver-lead solder paste (made by Tanaka Kikinzoku Kogyo Co.) was printed on portions to which the external terminals 13 for attaining connection to a power source would be attached, to form a solder layer.

Next, the external terminals 13 made of kovar were put on the solder layer and heated at 420° C. and allowed to reflow to attach the external terminals 13 onto the surface of the heating elements.

(8) Thermocouples for controlling temperature were sealed with polyimide to obtain the ceramic heater 10.

EXAMPLES 2 to 7

Ceramic heaters were produced-in the same way as Example 1 except that conditions for treating the side faces were set as follows. Table 1, which will be described later, shows the surface roughness Rmax of the side faces.

EXAMPLE 2

The side face was grinded with a diamond grindstone of #200 and was then subjected to sand blasting with SiC having an average particle diameter of 200 μm.

EXAMPLE 3

The side face was grinded with a diamond grindstone of #200.

EXAMPLE 4

The side face was grinded with a diamond grindstone of #400.

EXAMPLE 5

The side face was grinded with a diamond grindstone of #800.

EXAMPLE 6

The side face was polished with a diamond paste (made by Maruto Company) having an average particle diameter of 0.5 μm.

EXAMPLE 7

The side face was polished with a diamond paste (made by Maruto Company) having an average particle diameter of 0.25 μm.

EXAMPLE 8

Production of a Ceramic Heater Made of SiC (1) A composition made of 100 parts by weight of SiC powder (average particle diameter: 1.1 μm), 0.5 part by weight of $B_4C$ as a sintering aid, 12 parts by weight of an acrylic binder and an alcohol was subjected to spray-drying to make granular powder.

(2) Next, this granular powder was put into a mold and formed into a flat plate form to obtain a raw formed body(green).

(3) The raw formed body subjected to the above-mentioned working treatment was hot-pressed at 1900° C. and a pressure of 20 MPa to obtain a SiC ceramic plate having a thickness of 3 mm.

Next, this plate was cut out into a disk having a diameter of 210 mm and its side face was subjected to sand blasting with alumina having an average particle diameter of 5 μm to prepare a ceramic substrate having a surface roughness Rmax of 7 μm.

(4) A glass paste (made by Shouei Chemical Products Co., Ltd., G-5177) was applied to two main surfaces of the heater plate, and the heater plate was heated to 1000° C. to form a $SiO_2$ film 1 μm in thickness.

This formed product was subjected to drilling to make portions which would be through holes, into which lifter pins of a silicon wafer are inserted, and portions (diameter: 1.1 mm, and depth: 2 mm) which would be bottomed holes, in which thermocouples are embedded.

(5) A conductor containing paste was printed on the ceramic substrate obtained in the step (4) by screen printing. The printed pattern was made to a pattern of concentric circles as shown in FIG. 2.

The used conductor containing paste was Solvest PS603D made by Tokuriki Kagaku Kenkyu-syo, which is used to form plated through holes in printed circuit boards.

This conductor containing paste was a silver paste which is containing 7.5 parts by weight of metal oxides consisting of lead oxide (5% by weight), zinc oxide (55% by weight), silica (10% by weight), boron oxide (25% by weight) and alumina (5% by weight) per 100 parts by weight of silver. The silver particles had an average particle diameter of 4.5 μm, and were scaly.

(6) Next, the ceramic substrate on which the conductor containing paste was printed was heated and fired at 780° C. to sinter silver and lead in the conductor containing paste and bake them onto the substrate. Thus, the heating elements were formed. The silver-lead heating elements had a thickness of 5 μm, a width of 2.4 mm and a area resistivity of 7.7 mΩ/□.

(7) The substrate 31 formed in the step (6) was immersed into an electroless nickel plating bath consisting of an aqueous solution containing 80 g/L of nickel sulfate, 24 g/L of sodium hypophosphite, 12 g/L of sodium acetate, 8 g/L of boric acid, and 6 g/L of ammonium chloride to precipitate a metal covering layer (nickel layer) having a thickness of 1 μm on the surface of the silver-lead heating elements 12.

(8) By screen printing, a silver-lead solder paste (made by Tanaka Kikinzoku Kogyo Co.) was printed on portions to which the external terminals for attaining connection to a power source were attached, to form a solder layer.

Next, terminal pins made of kovar were put on the solder layer and heated at 420° C. and allowed to reflow to attach the external terminals onto the surface of the heating elements.

(9) Thermocouples for controlling temperature were fitted into the bottomed holes 14 and a ceramic adhesive (made by Toagosei Co., Ltd., Aron ceramic) was embedded therein to fix the thermocouples. Thus, a ceramic heater was obtained. This ceramic heater 10 was fixed on a supporting case in the manner that its side face would be exposed from the top of the supporing case.

EXAMPLES 9 to 13

Ceramic heaters were produced in the same way as Example 4 except that conditions for treating the side faces were set as follows. Table 1, which will be described later, shows the surface roughness Rmax of the side faces.

EXAMPLE 9

The side face was grinded with a diamond grindstone of #200 and was then subjected to sand blasting with SiC having an average particle diameter of 200 μm.

EXAMPLE 10

The side face was grinded with a diamond grindstone of #200.

EXAMPLE 11

The side face was grinded with a diamond grindstone of #400.

EXAMPLE 12

The side face was grinded with a diamond grindstone of #800.

EXAMPLE 13

The side face was polished with a diamond paste (made by Maruto Company) having an average particle diameter of 0.5 μm.

COMPARATIVE EXAMPLE 1

A ceramic heater was produced in the same way as in Example 1, but the side face of its ceramic substrate was polished with a diamond paste (made by Maruto Company) of 0.1 μm to make its surface roughness Rmax into 0.05 μm.

COMPARATIVE EXAMPLE 2

(1) A ceramic heater was produced in the same way as in Example 1, and subsequently the side face thereof was subjected to sand blasting with alumina having an average particle diameter of 250 μm to make unevenness of an Rmax of 210 μm according to JIS B 0601 on the side face 11c.

COMPARATIVE EXAMPLE 3

A ceramic heater was produced in the same way as in Example 8, but the side face of its ceramic substrate was polished with a diamond paste (made by Maruto Company) of 0.1 μm to make its surface roughness Rmax into 0.05 μm.

COMPARATIVE EXAMPLE 4

A ceramic heater was produced in the same way as in Example 8, and subsequently the side face thereof was subjected to sand blasting with alumina having an average particle diameter of 250 μm to make unevenness having an Rmax of 210 μm according to JIS B 0601 on the side face.

The ceramic heater according to Examples 1 to 13 and Comparative examples 1 to 4 was fitted into the seal ring 37 of the supporting case 30 shown in FIG. 3, and an electric current was sent to the ceramic heater. Thereafter, the temperature of the central portion was raised to 400° C. and 500° C. to measure the temperature difference ΔT between the central portion and the peripheral portion with a Thermoviewer (made by Japan Datum Company, IR-16-2012-0012). It was checked with visual observation whether small particles were generated or not. Furthermore, the temperature was raised to 400° C. in the time length of 45 seconds, and it was checked whether cracks were generated or not. The results are shown in Table 1.

TABLE 1

|  | Surface roughness Rmax (μm) | ΔT (° C.) (400° C.) | ΔT (° C.) (500° C.) | Crack | Small particles |
|---|---|---|---|---|---|
| Example 1 | 7 | 6 | 8 | None | None |
| Example 2 | 180 | 8 | 12 | None | None |
| Example 3 | 50 | 8 | 10 | None | None |
| Example 4 | 22 | 8 | 10 | None | None |
| Example 5 | 15 | 6 | 8 | None | None |
| Example 6 | 2 | 6 | 8 | None | None |
| Example 7 | 0.4 | 8 | 20 | None | None |
| Example 8 | 7 | 6 | 7 | None | None |
| Example 9 | 180 | 7 | 10 | None | None |
| Example 10 | 50 | 7 | 9 | None | None |
| Example 11 | 22 | 7 | 9 | None | None |
| Example 12 | 15 | 5 | 7 | None | None |
| Example 13 | 2 | 5 | 7 | None | None |
| Comparative Example 1 | 0.05 | 18 | 25 | Generated | None |
| Comparative Example 2 | 210 | 13 | 15 | Generated | Generated |
| Comparative Example 3 | 0.05 | 12 | 15 | Generated | None |
| Comparative Example 4 | 210 | 13 | 15 | Generated | Generated |

In the ceramic heaters obtained in Examples 1 to 13, ΔT (400° C.) was 5 to 8° C., and ΔT (500° C.) was 7 to 20° C. Thus, the temperature difference between the central portion and the peripheral portion was not very large. In the ceramic heaters obtained in Comparative examples 1 to 4, ΔT(400° C.) was 12 to 18° C., and ΔT (500° C.) was 15 to 25° C. Thus, the temperature difference between the central portion and the peripheral portion was large.

In the ceramic heaters according to Comparative examples, cracks were generated by rapid temperature-rising to 400° C. Furthermore, in Comparative examples 2 and 4, when the ceramic heaters were fitted, grains were released from the roughened surfaces to generate small particles.

EXAMPLE 14

(1) A paste obtained by mixing 100 parts by weight of aluminum nitride powder (made by Tokuyama Corp., and average particle diameter: 1.1 μm), 4 parts by weight of yttria (average particle diameter: 0.4 μm), 11.5 parts by weight of an acrylic resin binder, 0.5 part by weight of a dispersant, and 53 parts by weight of alcohols consisting of 1-butanole and ethanol was subjected to spray-drying, and the granules of the paste were filled up into a mold to perform molding, thereby obtaining a raw formed body having a thickness of 1.5 mm.

This raw formed body was sintered at 1890° C. at 200 kg/m² for 3 hours in nitrogen and processed by cutting, thereby obtaining a square ceramic plate-like body (ceramic substrate 2) having a thickness of 0.64 mm and the length of a side of 50.3 mm.

The side face thereof was subjected to sand blasting with alumina particles having an average particle diameter of 5 μm so as to make, on the side face, unevenness having an Rmax=7 μm.

(2) A conductor containing paste layer was formed on the ceramic substrate 2 obtained in the above-mentioned (1) by screen printing. The printed pattern was a concentric circle pattern as in the case of Example 1. As the conductor containing paste, a paste which contained silver (48% by weight), platinum (21% by weight), silica (1.0% by weight), boron oxide (1.2% by weight), zinc oxide (4.1% by weight), lead oxide (3.4% by weight), ethyl acetate (3.4% by weight), butyl Carbitol (17.9% by weight).

This conductor containing paste was a silver-platinum paste, silver particles had an average particle diameter of 4.5 μm and had a scaly shape. Platinum particles thereof had an average particle diameter of 0.5 μm and had a spherical form.

(3) After forming a conductor containing paste layer which become a resistance heating element 3, a thermistor circuit (not shown) and a thermistor pad (not shown), the ceramic substrate 2 was heated and fired at 780° C. to sinter silver and platinum in the conductor containing paste and bake the paste on the ceramic substrate 2, thereby forming the resistance heating element 3, the thermistor circuit and the thermistor pad. The resistance heating element 3 had a thickness of 5 μm, a width of 2.4 mm and an area resistivity of 7.7 mΩ/□.

(4) The ceramic substrate 2 which was produced in the above-mentioned (3) was immersed in an electroless nickel plating bath consisting of an aqueous solution containing 80 g/L of nickel sulfate, 24 g/L of sodium hypophosphite, 12 g/L of sodium acetate, 8 g/L of boric acid, and 6 g/L of ammonium chloride to precipitate a metal covering layer (nickel layer) 3a having a thickness of 1 μm on the surfaces of the silver-platinum resistance heating element 3, thermistor circuit and thermistor pad.

(5) Next, a solder paste was printed on the thermistor pad, a thermistor (not shown) was put on the thermistor pad which was heated at 200° C. and thereby mounted.

Furthermore, a lead wire was jointed to the thermistor circuit and the resistance heating element 3 by a brazing filler material to thereby obtain a ceramic heater 50.

(6) The diagonal corners of the ceramic heater 50 were supported by stainless pins 74, thereby obtaining an element for temperature adjustment 1.

(7) Further, the element for temperature adjustment 1 was fixed to a stainless box shaped as a casing (not shown) by an epoxy adhesive material to provide a temperature adjustment part, and a quartz type optical waveguide 5 comprising a core drawn as a Y-branch was fixed to the element for temperature adjustment 1 by an epoxy adhesive material to obtain an optical module 40.

EXAMPLE 15

An optical module 40 was produced in the same manner as that of Example 14 except that polishing of the side face was performed with a diamond paste (made by Maruto Company) having an average particle diameter of 0.15 μm. The Rmax of the side face was 0.1 μm.

EXAMPLE 16

An optical module 40 was produced in the same manner as that of Example 14 except that grinding of the side face was performed with a diamond grindstone of #200 and sand blasting was then performed with SiC having an average particle diameter of 200 μm.

The Rmax of the side face was 200 μm.

EXAMPLE 17

An optical module 40 was produced in the same manner as that of Example 14 except that grinding of the side face was performed with a diamond grindstone of #200. The Rmax of the side face was 55 μm.

COMPARATIVE EXAMPLE 5

An optical module 40 was produced in the same manner as that of Example 14 except that the ceramic substrate was cut by a cutting machine without performing the side face treatment. The Rmax of the side face was 298 µm.

COMPARATIVE EXAMPLE 6

An optical module 40 was produced in the same manner as that of Example 14 except that the side face of the ceramic substrate was subjected to sand blasting with alumina particles having an average particle diameter of 250 µm so as to make, on the side face, unevenness having an Rmax =210 µm.

COMPARATIVE EXAMPLE 7

An optical module 40 was produced in the same manner as that of Example 14 except that polishing of the side face was performed with a diamond paste (made by Maruto Company) having an average particle diameter of 0.1 µm.

The Rmax of the side face was 0.05 µm.

COMPARATIVE EXAMPLE 8

An optical module 40 was produced in the same manner as that of Comparative Example 7 except that polishing of the side face was further continued with colloidal silica sol of 50 nm.

The Rmax of the side face was 0.01 µm.

The in-plane temperature uniformity of each of the optical modules according to Examples 14 to 17 and Comparative Examples 5 to 8 was measured. The in-plane temperature uniformity was evaluated by measuring the temperature difference ΔT between the highest and lowest temperatures by a Thermoviewer (made by Japan Datum Company, IR-16-2012-0012) in condition that the temperature of the optical module was set at 80° C.

In addition, the intensity differences between the light beams outputted from the Y-branch were calculated when a laser beam of 1550 nm was guided.

Ideally, the intensities of outputted infrared rays are equal. However, the refractive indexes thereof change by a temperature distribution. If branching characteristic varies, intensity difference occurs. The intensity difference was expressed by [(relatively high intensity−relatively low intensity)/relatively high intensity]×100 (%)

The results were shown in Table 2.

TABLE 2

| | surface roughness Rmax of side face (µm) | temperature difference ΔT (° C.) | intensity difference (%) |
|---|---|---|---|
| Example 14 | 7 | 0.1 | 0.01 |
| Example 15 | 0.1 | 0.1 | 0.01 |
| Example 16 | 200 | 0.1 | 0.01 |
| Example 17 | 55 | 0.1 | 0.01 |
| Comparative Example 5 | 298 | 2.0 | 1.01 |
| Comparative Example 6 | 210 | 1.5 | 0.98 |
| Comparative Example 7 | 0.05 | 1.5 | 0.98 |
| Comparative Example 8 | 0.01 | 1.5 | 0.99 |

Regarding the optical module obtained in each of Examples 14 to 17, ΔT=0.1° C., the difference between the highest and lowest temperatures was small and the intensity difference was as small as 0.01%. On the other hand, regarding the optical module obtained in each of Comparative Examples 5 to 8, by contrast, ΔT=1.5 to 2.0° C., the difference between the highest and lowest temperatures was large and the intensity difference was as large as 0.98 to 1.01%.

INDUSTRIAL APPLICABILITY

As described above, according to the ceramic heater of the present invention, its side face is appropriately roughened. Therefore, conduction of heat from the ceramic heater to a supporting case or air is suppressed so that the temperature of its ceramic substrate can be made uniform.

What is claimed is:

1. A ceramic heater comprising
   a ceramic substrate having two opposing surfaces and a side face, and
   a heating element on one of the two opposing surfaces of the ceramic substrate or inside the ceramic substrate, wherein
   the surface roughness Rmax of the side face of the ceramic substrate is from 0.1 to 200 µm according to JIS B 0601.

2. The ceramic heater according to claim 1, wherein said surface roughness Rmax is from 0.5 to 200 µm according to JIS B 0601.

3. The ceramic heater according to claim 1, wherein said ceramic substrate is fitted into a supporting case.

4. The ceramic heater according to claim 1, wherein said ceramic substrate is made of a nitride ceramic.

5. The ceramic heater according to claim 1, wherein said ceramic substrate is made of a carbide ceramic or an oxide ceramic.

6. The ceramic heater according to claim 1, wherein said ceramic heater is for heating a semiconductor wafer.

7. The ceramic heater according to claim 1, wherein the thickness of said ceramic substrate is over 1.5 mm.

* * * * *